US012635119B2

(12) United States Patent
Chen

(10) Patent No.: US 12,635,119 B2
(45) Date of Patent: May 19, 2026

(54) ELASTIC CLAMPING STRUCTURE AND SUBSTRATE CARRIER

(71) Applicant: GROUP UP INDUSTRIAL CO., LTD., Taoyuan City (TW)

(72) Inventor: An-Shun Chen, Taoyuan City (TW)

(73) Assignee: GROUP UP INDUSTRIAL CO., LTD., Taoyuan City (TW)

( * ) Notice: Subject to any disclaimer, the term of this patent is extended or adjusted under 35 U.S.C. 154(b) by 325 days.

(21) Appl. No.: 18/380,714

(22) Filed: Oct. 17, 2023

(65) Prior Publication Data

US 2025/0121509 A1    Apr. 17, 2025

(51) Int. Cl.
*H05K 13/00* (2006.01)
*B65G 49/06* (2006.01)
*F16B 2/10* (2006.01)

(52) U.S. Cl.
CPC ....... *H05K 13/0069* (2013.01); *B65G 49/061* (2013.01); *F16B 2/10* (2013.01)

(58) Field of Classification Search
CPC .. B65G 49/061; B65G 49/063; B65G 49/064; B65G 49/066; B65G 49/07; F16B 2/10; F16B 2/16; H01L 21/673; H01L 21/67309; H01L 21/6732; H01L 21/67333; H01L 21/6734; H01L 21/67346; H01L 21/6773; H01L 21/68728; H05K 13/0061–0069
See application file for complete search history.

(56) References Cited

U.S. PATENT DOCUMENTS

| | | | | |
|---|---|---|---|---|
| 8,152,150 | B2 * | 4/2012 | Li | H05K 7/1053 |
| | | | | 118/503 |
| 8,550,441 | B2 * | 10/2013 | Ishino | B65G 49/062 |
| | | | | 269/254 R |
| 2015/0090851 | A1 * | 4/2015 | Fujiu | F16B 2/10 |
| | | | | 248/316.5 |

OTHER PUBLICATIONS

Chen. Taiwan Patent TW M602806U (Year: 2020).*

* cited by examiner

*Primary Examiner* — Tyrone V Hall, Jr.

(57) ABSTRACT

An elastic clamping structure for mounting on a load-bearing member is disclosed to include a fastener structure, which has each of both ends thereof fixed to the load-bearing member through a fastener, and a clamping structure, which has one end connected to the. fastener structure through a spring member, the other end provided with a clamping member and the central body formed by a cover. The clamping member has both ends respectively mounted with a rolling element and a middle part connected to one end of the cover. The other end of the cover is close to the fastener structure. The clamping member is in the shape of a long strip.

11 Claims, 7 Drawing Sheets

300

ELASTIC CLAMPING STRUCTURE AND SUBSTRATE CARRIER

BACKGROUND OF THE INVENTION

1. Field of the Invention

The present invention relates to A clamping carrier structure, especially a substrate carrier that can clamp a flexible substrate vertically and transfer it vertically through a tool end of a transfer device.

2. Description of the Related Art

With the development of electronic products towards high performance and small size, traditional printed circuit boards with single-layer circuits have been unable to meet the current demand for high-density wiring. Therefore, today's printed circuit boards have developed into a multi-layer circuit structure to meet the multi-functional high wiring density of electronic products and the purpose of reducing the area of the circuit board.

The flexible sheets used under the current advanced process are getting thinner and thinner, for example, the thickness is only 0.2 mm to 3 mm. The flexible sheet is easily broken or deformed when it is transferred, and the flexible sheet must also go through the drying process of the baking oven during the production process. Under this high temperature process, it is also easy to break or deform the flexible sheet due to thermal expansion, which will reduce production efficiency and increase labor time and cost, making it difficult to mass-produce.

SUMMARY OF THE INVENTION

The present invention provides an elastic clamping structure, especially for installation on a load-bearing member. The elastic clamping structure comprises a fastener structure and a clamping structure. The fastener structure has two opposite ends thereof respectively fixed to the load-bearing member through a fastener. The clamping structure has one end thereof connected to the fastener structure through a spring member, an opposite end thereof terminating in a clamping member, and a central body formed by a cover between the two opposite ends thereof. The clamping member has two opposite ends thereof respectively mounted with a rolling element, and a middle part thereof connected to one end of the cover. The cover has an opposite end thereof disposed close to the fastener structure. The clamping member is in the shape of a long strip.

The present invention also provides a substrate carrier used to hold a flexible substrate vertically and transfer the flexible substrate vertically through a tool end of a transfer device. The substrate carrier comprises a load-bearing member, a plurality of fastener structures, a plurality of clamping structures, and at least one support member. The load-bearing member comprises an upper frame plate, a lower frame plate, a first side frame plate and a second side frame plate. The first side frame plate and the second side frame plate are respectively connected to both ends of the upper frame plate and the lower frame plate, so that a central portion of the load-bearing member is hollow. Each of four corners of the central portion is respectively provided with a first arc-shaped groove. The upper frame plate, the first side frame plate and the second side frame plate each have at least one through hole. The fastener structures are respectively arranged next to the through holes. Each fastener structure has two ends thereof respectively fixed to the load-bearing member through a fastener. The plurality of clamping structures are respectively arranged on the upper frame plate, the first side frame plate and the second side frame plate, and are used to jointly clamp the flexible substrate in vertical. Each clamping structure has one end thereof connected to one respective fastener structure through a spring member, an opposite end thereof terminating in a clamping member, and a central body formed by a cover between the two opposite ends thereof and located in front of one respective through hole. The clamping member has two opposite ends thereof respectively mounted with a rolling element, and a middle part thereof connected to one end of the cover. The cover having an opposite end thereof disposed close to one respective fastener structure. The clamping member is in the shape of a long strip. The at least one support member is set on the lower frame plate through a fastener, and is used to support the flexible substrate in vertical. The clamping structures are used to jointly clamp the flexible substrate in vertical. The thickness of the flexible substrate is 0.2 mm to 3 mm.

The object, technical content, characteristics and effects achieved by this invention will be more easily understood through the detailed description of the preferred embodiment below.

DETAILED DESCRIPTION OF THE PREFERRED EMBODIMENT

In order to solve the problems related to handling flexible substrates with a thickness of only 0.2 mm to 3 mm for high temperature processes under the existing advanced process, after years of research and development, the inventor has improved the criticism of the existing products. The following will introduce in detail how the present invention uses an elastic clamping structure and a substrate carrier to achieve the most efficient functional demands.

Figure 1:
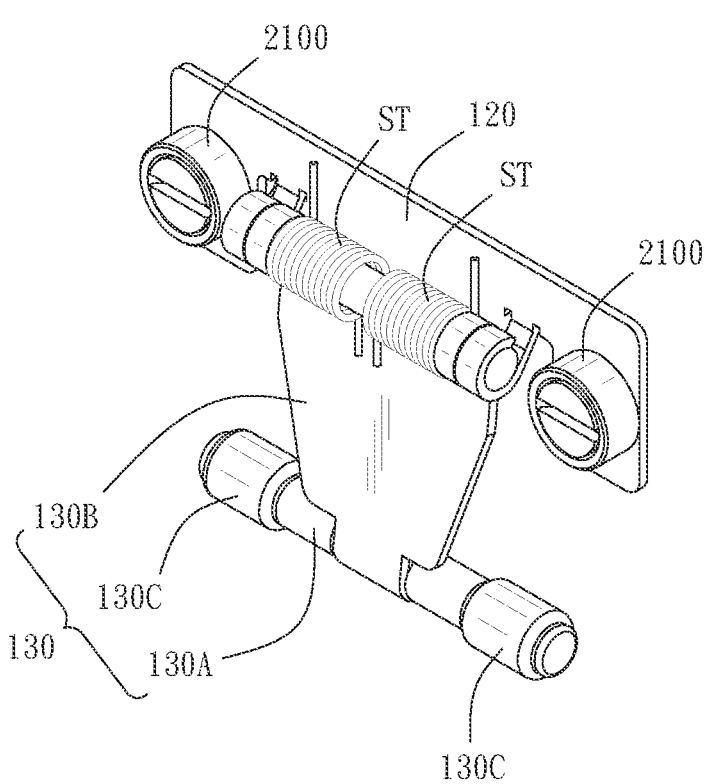
FIG. 1 is a schematic diagram of the elastic clamping structure of the present invention.

Please refer to FIG. 1, which is a schematic diagram of the elastic clamping structure of the present invention. As shown in the figure, the elastic clamping structure 300 is particularly suitable for installation on a load-bearing member. The elastic clamping structure 300 comprises a fastener structure 120 and a clamping structure 130. Both ends of the fastener structure 120 are respectively fixed to the load-bearing member through a fastener 2100. One end of the clamping structure 130 is connected to the fastener structure 120 through a spring member ST, and the other end of the clamping structure 130 is a clamping member 130A, and the central body of the clamping structure 130 is a cover 130B. Each end of the clamping member 130A has a rolling element 130C, and the middle of the clamping member 130A is connected to one end of the cover 130B. The other end of the cover 130B is close to the fastener structure 120. The clamping member 130A is in the shape of a long strip. The clamping member 130A is parallel to the fastener structure 120. The material of the rolling elements 130C is plastic, ceramic, metal alloy, quartz or glass.

Figure 2:
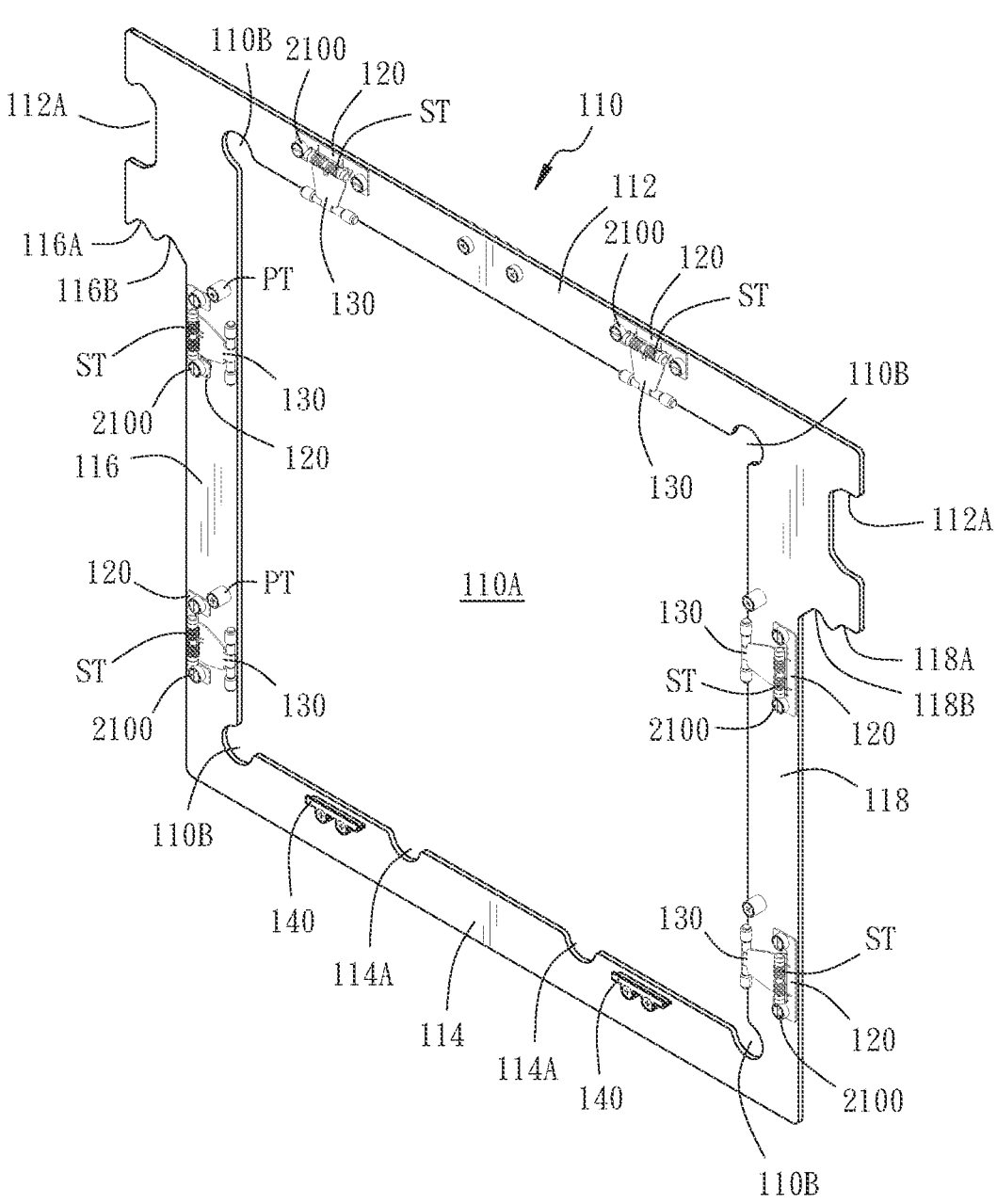
FIG. 2 is a schematic diagram of the substrate carrier of the present invention.
Figure 3:
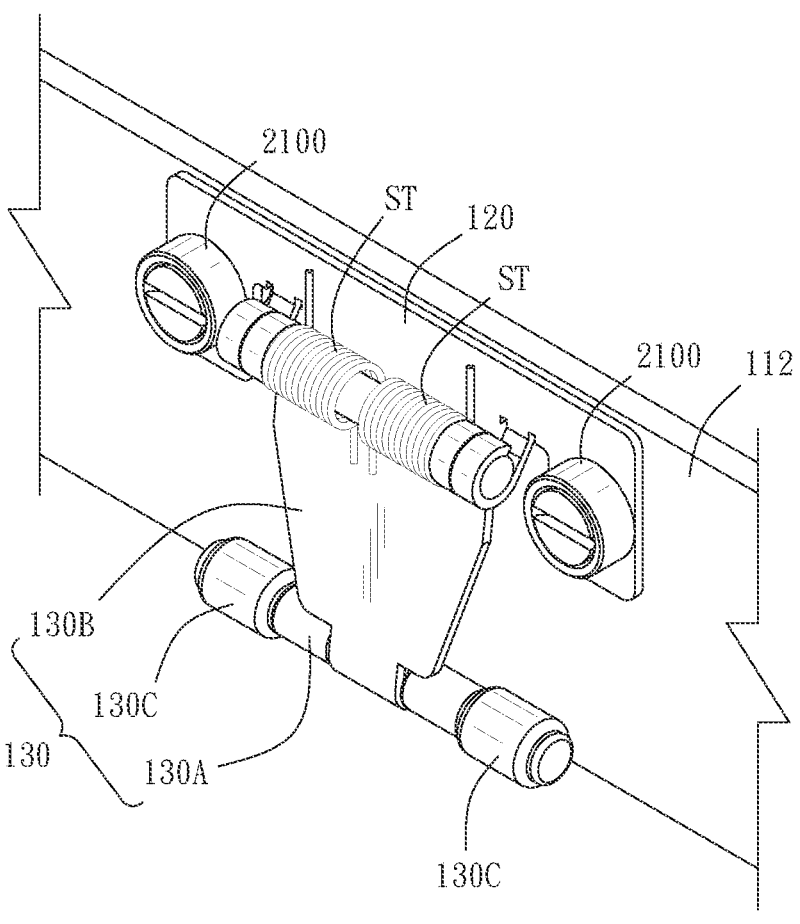
FIG. 3 is a partial schematic diagram of the elastic clamping structure of the present invention applied to the substrate carrier.
Figure 4:
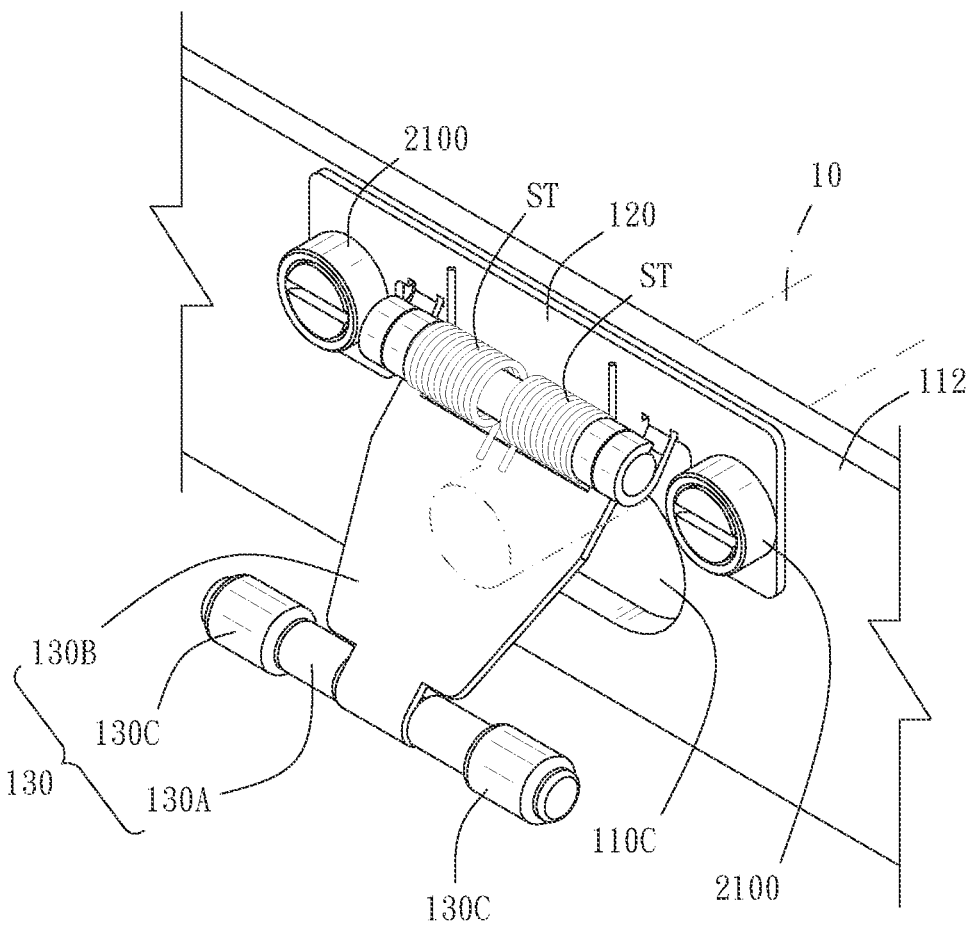
FIG. 4 is a schematic diagram of the present invention using a push rod to pass through the through hole and push up the cover of the respective clamping structure.
Figure 5:
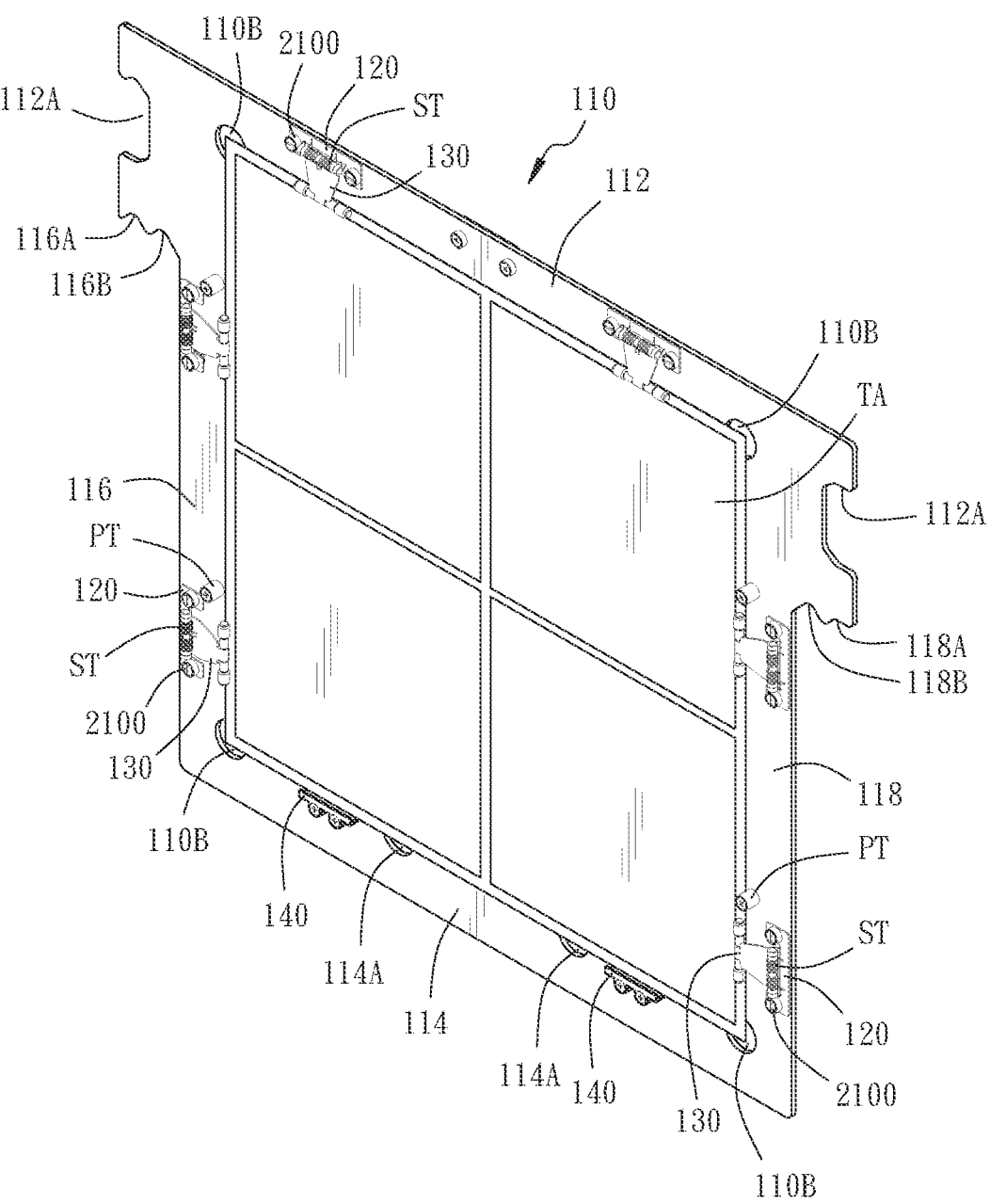
FIG. 5 is a schematic diagram of the substrate carrier clamping the flexible substrate of the present invention.
Figure 6:
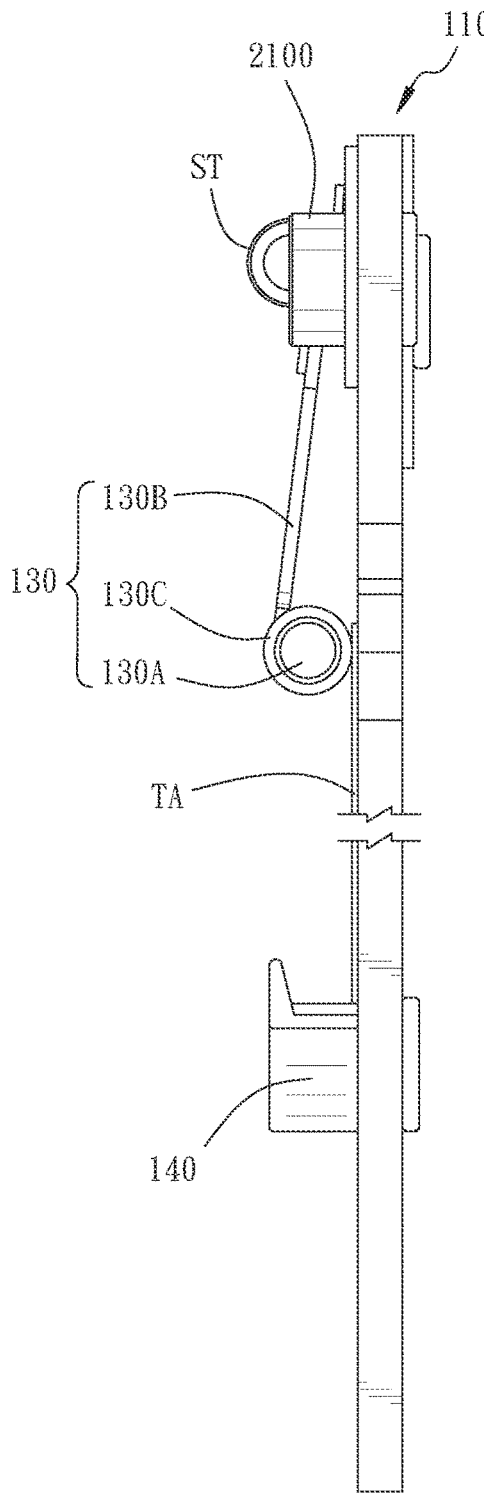
FIG. 6 is a side view of the substrate carrier of the present invention clamping the flexible substrate.
Figure 7:
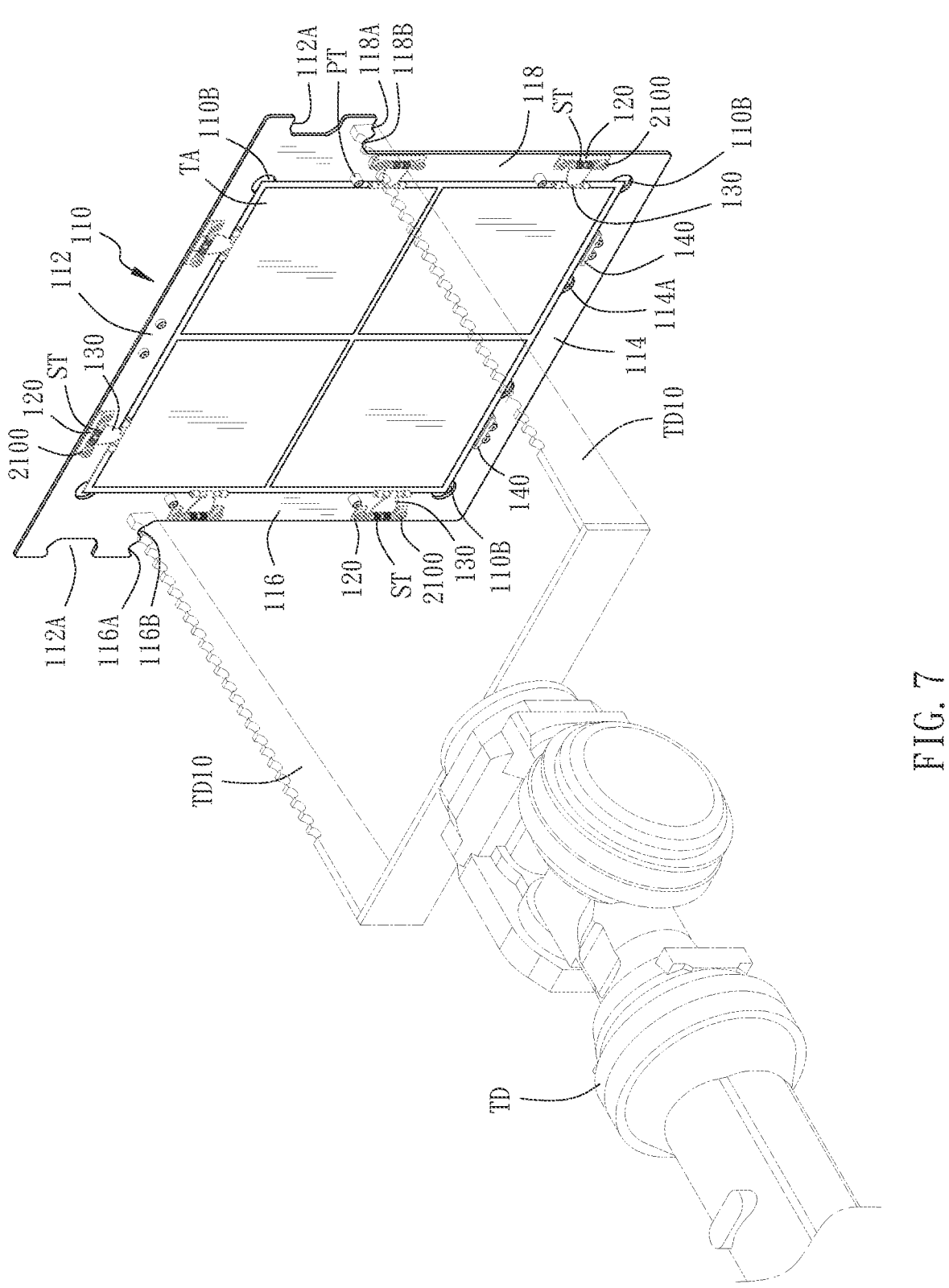
FIG. 7 is a schematic diagram of the tool end of the transfer device of the present invention performing vertical transfer.

The following will further explain how to apply the elastic clamping structure of the present invention to the substrate carrier to achieve the most efficient functional requirements. Please refer to FIGS. 2-7, where FIG. 2 is a schematic diagram of a substrate carrier, FIG. 3 is a partial schematic diagram of the elastic clamping structure applied to the substrate carrier, FIG. 4 is a schematic diagram of the present invention using a push rod to pass through the through hole and push up the cover of the respective clamping structure, FIG. 5 is a schematic diagram of the substrate carrier clamping the flexible substrate, FIG. 6 is a side view of the substrate carrier of the present invention clamping the flexible substrate, and FIG. 7 is a schematic diagram of a tool end of a transfer device performing vertical transfer. Since the thickness of a flexible substrate TA under advanced manufacturing processes is only 0.2 mm to 3 mm, if it is transferred horizontally, the flexible substrate TA will collapse or deform. Therefore, the vertical transfer method is very necessary. As shown in the figures, the content of the present invention also discloses a substrate carrier 100, which is particularly suitable for holding the flexible substrate TA in a vertical manner and transferring it vertically through the tool end TD10 of the transfer device TD. The flexible substrate TA can be a flexible circuit board, a flexible substrate or a thin glass plate, but is not limited to these three types. The substrate carrier 100 comprises a load-bearing member 110, a plurality of fastener structures 120, a plurality of clamping structures 130, at least one support member 140 and a plurality of positioning members PT. In the present invention, the entire load-bearing member 110 is made of non-metal material, but it is not limited to this. The load-bearing member 110 comprises an upper frame plate 112, a lower frame plate 114, a first side frame plate 116 and a second side frame plate 118. The first side frame plate 116 and the second side frame plate 118 are respectively connected to both ends of the upper frame plate 112 and the lower frame plate 114, so that the central portion 110A of the load-bearing member 110 is hollow. The four corners of the central portion 110A each have a first arc-shaped groove 110B. The upper frame plate 112, the first side frame plate 116 and the second side frame plate 118 each have at least one through hole 110C. In addition, the lower frame plate 114 has at least one second arc-shaped groove 114A. In the embodiment of the present invention, the lower frame plate 114 has two second arc-shaped grooves 114A, but it is not limited to two. In addition, the fastener structures 120 are respectively arranged next to the through holes 110C, wherein the two ends of each fastener structure 120 are respectively fixed to the load-bearing member through a fastener 2210. The above-mentioned plurality of positioning members PT are arranged on the first side frame plate 116 and the second side frame plate 118.

The fastener structures 120 are fixed with the upper frame plate 112, the first side frame plate 116 and the second side frame plate 118 through the corresponding fasteners 210. Both ends of the upper frame plate 112 respectively have an extension section provided with an upper hanging portion 112A. The outer extending sections of the first side frame plate 116 and the second side frame plate 118 have insertion portions 116B and 118B and lower hanging portions 116A and 118A, respectively. Each of the lower hanging portions 116A and 118A is formed on the outer side of each of the insertion portions 116B and 118B.

The clamping structures 130 are respectively arranged on the upper frame plate 112, the first side frame plate 116 and the second side frame plate 118. One end of each clamping structure 130 is connected to the respective fastener structure 120 through a spring member ST, and the other end of each clamping structure 130 is a clamping member 130A. The central body of each clamping structure 130 is a cover 130B and is located in front of the through hole 110C. The clamping member 130A has a rolling element 130C on each of the two opposite ends thereof, the middle of the clamping member 130A is connected to one end of the cover 130B, and the other end of the cover 130B is close to the fastener structure 120. The clamping member 130A is in the shape of a long strip. The center of the fastener structure 120 is connected to the clamping structure 130 through the spring member ST. The spring member ST causes the cover 130B to return to its original position after being subjected to external force. That is to say, the original position of the cover 130B is defined as the position when covering the through hole 110C. In addition, the plurality of clamping structures 130 are mainly used to jointly clamp the upright flexible substrate TA, and in the embodiment of the present invention, the thickness of the flexible substrate TA is 0.2 mm to 3 mm. In this embodiment, the rolling elements 130C of the clamping members 130A of the clamping structures 130 are mainly used to contact and clamp the flexible substrate TA, and the rolling elements 130C are made of plastic, ceramics, metal alloys, quartz or glass, so they will not damage the flexible substrate TA, but not limited to the above. Furthermore, as shown in FIG. 4, in the first embodiment, push rods 10 are used to pass through the respective through holes 110C and push the covers 130B of the multiple clamping structures 130 upward, and then the flexible substrate TA can be placed on the substrate carrier 100. Then the push rods 10 exit the through holes 110C to allow the rolling elements 130C of the multiple clamping structures 130 to contact and clamp the flexible substrate TA. When an abnormal event occurs, for example, when the flexible substrate TA slightly slides or moves, the rolling elements 130C can also be slightly rolled accordingly to avoid damage to the surface of the flexible substrate TA. Finally, as shown in FIG. 5. it is worth mentioning that in order to know immediately whether the covers 130B of the clamping structures 130 are normal or not, the push rods 10 are respectively provided with a pressure sensor (not shown). When the push rods 10 are used to pass through the through holes 110C and push the multiple clamping structures 130, the pressure sensor will feel the restoring force of the respective cover 130B to determine whether the elasticity of the respective cover 130B is normal. Once the pressure sensor senses that the elasticity of the respective cover 130B is abnormal, the manager will be notified to replace it to avoid the problem that the clamping structures 130 cannot clamp the flexible substrate TA.

In addition, the above support members 140 are locked and arranged on the lower frame plate 114 through fasteners 2100. These support members 140 can be used to support the upright flexible substrate TA, as shown in FIG. 6.

Next, the operation of the substrate carrier 100 according to the embodiment of the present invention will be further described.

Please also refer to FIG. 7, which is a schematic diagram of the tool end of the transfer device of the present invention performing vertical transfer. The main description below is how to move the flexible substrate TA with a thickness of 0.2 mm to 3 mm under the advanced process and send it to the baking oven for a high temperature process or other placement locations. This not only solves the difficulty of transferring the flexible substrate TA, but also solves the problem that the flexible substrate TA will not be broken or deformed under the high temperature process. First of all, the number of six is used as an example, but not limited to six. In this embodiment, there will be six push rods respectively passing through the six through holes 110C and pushing the six clamping structures 130. Next, the flexible substrate TA is clamped by the robot arm and entered through the second arc-shaped grooves 114A and the flexible substrate TA is sent to the substrate carrier 100 and the positioning is completed through the positioning members PT and the support members 140. After the positioning of the present embodiment is completed, the six push rods are respectively withdrawn from the six through holes 110C and the six clamping structures 130 are clamped to the upright flexible substrate TA. At this time, the robot arm is exited from the second arc-shaped grooves 114A. It should be noted that, in this embodiment, each of the four corners of the central portion 110A has one first arc-shaped groove 110B, which can prevent the four corners of the flexible substrate TA from hitting the substrate carrier 100 when the flexible substrate TA is just positioned with the substrate carrier 100.

Next, since one substrate carrier 100 can only clamp one flexible substrate TA, the automated workflow will continue the above actions to sequentially transfer about 20-30 flexible substrates TA to the respective substrate carriers 100. In the following content, 24 are used as an example (but not limited to 24). Once the transfer of the 24 flexible substrates TA to the respective substrate carriers 100 is completed, the tool end TD10 of the transfer device TD will perform a vertical transfer of the 24 substrate carriers 100. Each of the insertion portions 116B and 118B is used for the tool end TD10 of the transfer device TD to be inserted and mounted to transport multiple flexible substrates TA, as shown in FIG. 7 (only one is shown in FIG. 7 for easy viewing).

To sum up, the elastic clamping structure and substrate carrier disclosed by the present invention can achieve the following effects:

1. By corresponding rolling of the rolling elements, the flexible substrate is prevented from being damaged during slight sliding.
2. Place and handle the flexible substrate in vertical to avoid cracking or deformation.
3. Use material with substantially the same expansion and thermal conductivity as the flexible substrate to avoid cracking or deformation during high temperature process.
4. Under the advanced process, flexible substrates can be transferred in batches and the baking and heating process can be performed.

What is claimed is:

1. An elastic clamping structure for mounting to a load-bearing member, the elastic clamping structure comprising:
a fastener structure, said fastener structure having two opposite ends thereof respectively fixed to said load-bearing member through a fastener; and
a clamping structure, said clamping structure having one end thereof coupled to said fastener structure through a spring member, an opposite end thereof terminating in a clamping member and a central body formed by a cover between the two opposite ends thereof, the cover configured to cover an opening of the load-bearing member, said spring member biasing said cover to cover the opening, said clamping member having two opposite ends thereof respectively mounted with a cylindrical rolling element and a middle part thereof connected to one end of said cover, said cover having an opposite end thereof disposed adjacent to said fastener structure, said clamping member being in the shape of a strip;
wherein said clamping member is parallel to said fastener structure; and
wherein said rolling elements are configured to roll when clamping a substrate sliding with respect to the load-bearing member to prevent damage to the substrate during the sliding.

2. The elastic clamping structure as claimed in claim 1, wherein the material of said rolling elements is selectively plastic, ceramic, metal alloy, quartz or glass.

3. A substrate carrier used to hold a flexible substrate vertically and transfer said flexible substrate vertically through a tool end of a transfer device, said flexible substrate having a thickness of 0.2 mm to 3 mm, said substrate carrier comprising:
a load-bearing member comprising an upper frame plate, a lower frame plate, a first side frame plate and a second side frame plate, said first side frame plate and said second side frame plate being respectively connected to both ends of said upper frame plate and said lower frame plate, so that a central portion of said loadbearing member defined by inner edge surfaces of the upper frame plate, the lower frame plate, the first side frame plate and the second side frame plate is an opening, each of four corners of said central portion being respectively provided with a first arc-shaped groove, said upper frame plate, said first side frame plate and said second side frame plate each having at least one through hole, the inner edge surface of said lower plate frame comprising at least one second arc-shaped groove configured to accept a robotic arm holding the flexible substrate;
a plurality of fastener structures respectively arranged next to said through holes, each said fastener structure having two ends thereof respectively fixed to said load-bearing member through a fastener;
a plurality of clamping structures respectively arranged on said upper frame plate, said first side frame plate and said second side frame plate and used to jointly clamp said flexible substrate in a vertical position, each said clamping structure having one end thereof coupled to one respective said fastener structure through a spring member, an opposite end thereof terminating in a clamping member and a central body formed by a cover between the two opposite ends thereof, said cover located in front of a respective one of said through holes, said clamping member having two opposite ends thereof respectively mounted with a rolling element and a middle part thereof connected to one end of said cover, said cover having an opposite end thereof disposed adjacent to a respective one of said fastener structures, said clamping member being in the shape of a strip;
at least one support member respectively set on said lower frame plate through one respective said fastener, said at least one support member being used to support said flexible substrate in vertical; and a plurality of positioning members arranged on said first side frame plate and said second side frame plate configured to position the flexible substrate within the central portion of the load-bearing member.

4. The substrate earner as claimed in claim 3, wherein said through holes are for a respective push rod to pass through one respective said through hole and push up the said cover of one respective said clamping structure.

5. The substrate earner as claimed in claim 3, wherein said fastener structures are fixed to said upper frame plate, said first side frame plate and said second side frame plate through the corresponding said fasteners.

6. The substrate carrier as claimed in claim 3, wherein each said fastener structure has the center thereof connected to one respective said clamping structure through a spring member, which allows the respective said cover to return to the original position after being subjected to external force.

7. The substrate carrier as claimed in claim 3, wherein said rolling elements of said clamping members of said clamping structures are used to contact and clamp said flexible substrate, and the material of said rolling elements is selectively plastic, ceramic, metal alloy, quartz or glass.

8. The substrate earner as claimed in claim 3, wherein said upper frame plate comprises an upper hanging portion located on an extension section at each of two opposite ends thereof.

9. The substrate carrier as claimed in claim 3, wherein said first side frame plate and said second side frame plate each have an outer extending section provided with an insertion portion and a lower hanging portion, each said lower hanging portion being formed on an outer side of the respective said insertion portion.

10. The substrate carrier as claimed in claim 9, wherein each said insertion portion is for said tool end of said transfer device to insert and hang to transport said flexible substrate.

11. The substrate carrier as claimed in claim 3, wherein said lower frame plate comprises at least one second arc-shaped groove.

\* \* \* \* \*